United States Patent
Rodder et al.

(10) Patent No.: US 6,242,295 B1
(45) Date of Patent: Jun. 5, 2001

(54) METHOD OF FABRICATING A SHALLOW DOPED REGION FOR A SHALLOW JUNCTION TRANSISTOR

(75) Inventors: Mark S. Rodder, University Park; Douglas T. Grider, McKinney; Katherine Violette, Dallas, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/225,580

(22) Filed: Jan. 5, 1999

Related U.S. Application Data

(60) Provisional application No. 60/070,437, filed on Jan. 5, 1998.

(51) Int. Cl.[7] .............................................. H01L 21/8238
(52) U.S. Cl. ............................................................ 438/231
(58) Field of Search ................................... 438/197, 199, 438/201, 202, 207, 208, 223, 224, 230, 231

(56) References Cited

U.S. PATENT DOCUMENTS

| | | | |
|---|---|---|---|
| 4,599,789 | * | 7/1986 | Gasner ................................. 29/571 |
| 5,242,847 | * | 9/1993 | Ozturk et al. ......................... 437/41 |

* cited by examiner

*Primary Examiner*—David Nelms
*Assistant Examiner*—Quoc Hoang
(74) *Attorney, Agent, or Firm*—Peter K. McLarty; W. James Brady, III; Frederick J. Telecky, Jr.

(57) ABSTRACT

A method of forming a plurality of shallow junction transistors, the method comprising the steps of providing a substrate (10) having a first region (13) and a second region (15). The first region (13) and the second region (15) include a first channel region (14) and a second channel region (16), respectively. A first gate (22) is formed proximate the first channel region (14) and is separated from the substrate (10) by a portion of a primary insulation layer (20). A second gate (24) is formed proximate the second channel region (16) and is separated from the substrate by a portion of the primary insulation layer (20). A dopant layer (34) is then formed outwardly of the substrate (10) proximate the first region (13) and the second region (15). The dopant layer (34) proximate the first region (13) is implanted with a first dopant (40). The dopant layer (34) proximate the second region (15) is implanted with a second dopant (48). A portion of the first dopant (40) in the dopant layer (34) is diffused into the substrate (10) proximate the first region (13) to form a first shallow doped region (50), and a portion of the second dopant (48) in the dopant layer (34) is diffused into the substrate (10) proximate the second region (15) to form a second shallow doped region (52). The first shallow doped region (50) may form a source and a drain for a first shallow junction transistor (54) and the second shallow doped region (52) may form a source and a drain for a second shallow junction transistor (55).

20 Claims, 5 Drawing Sheets

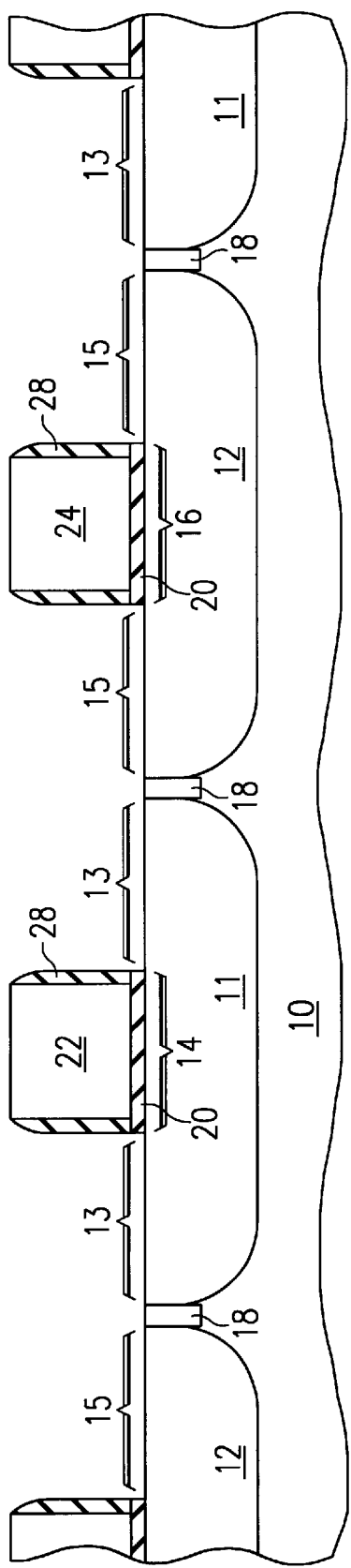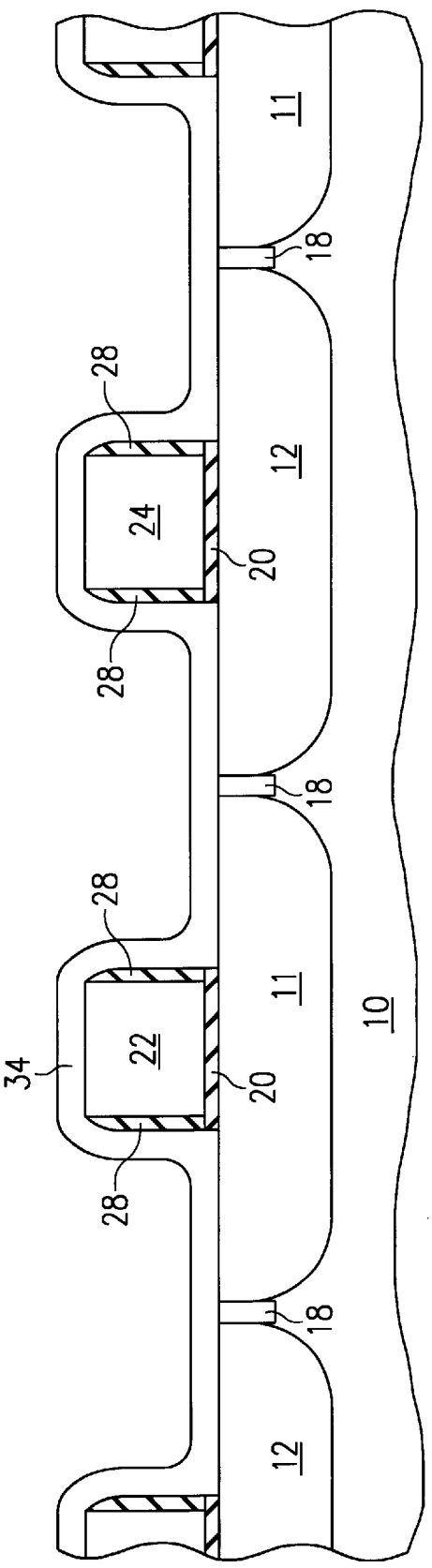

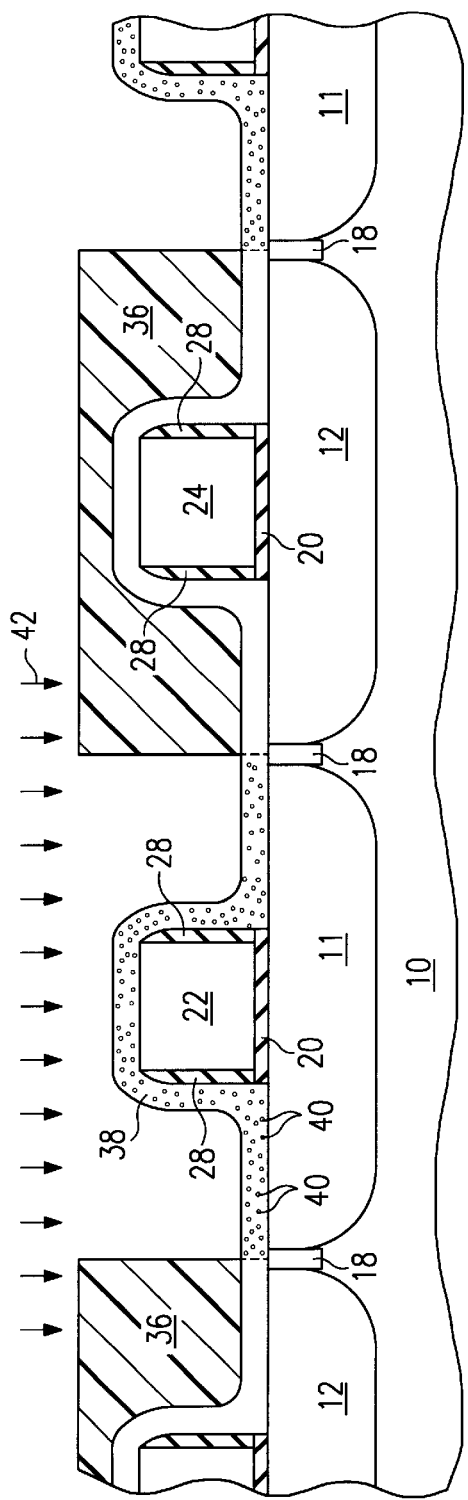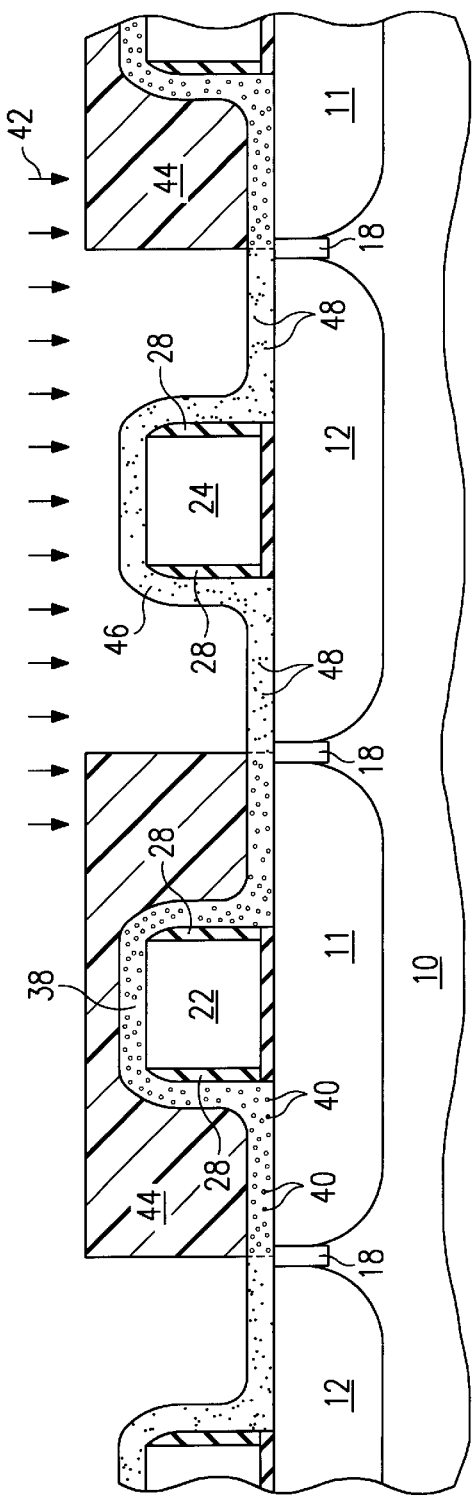

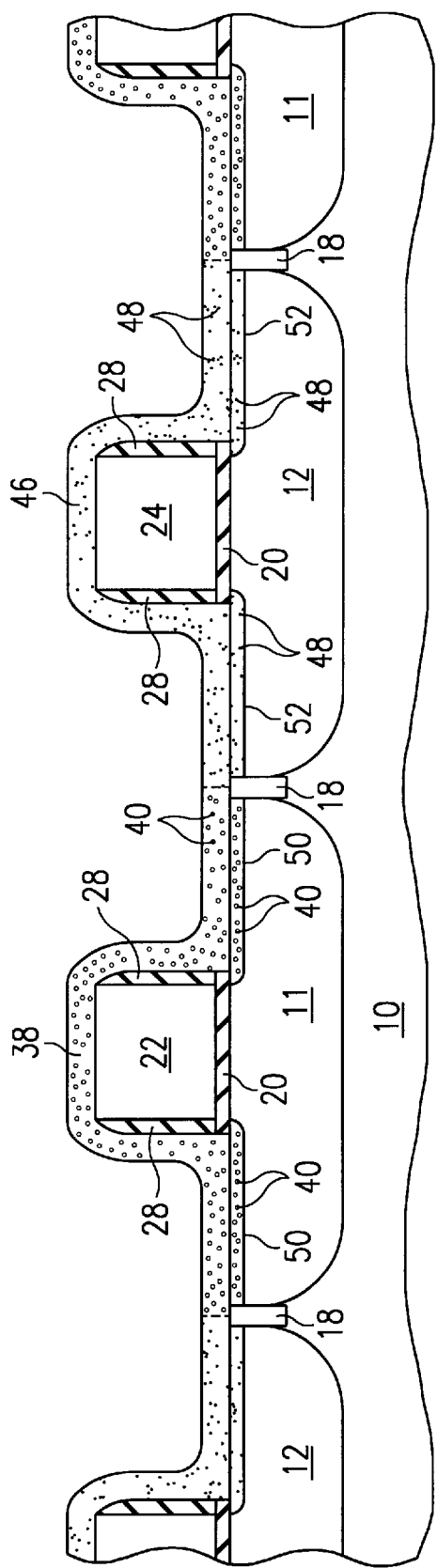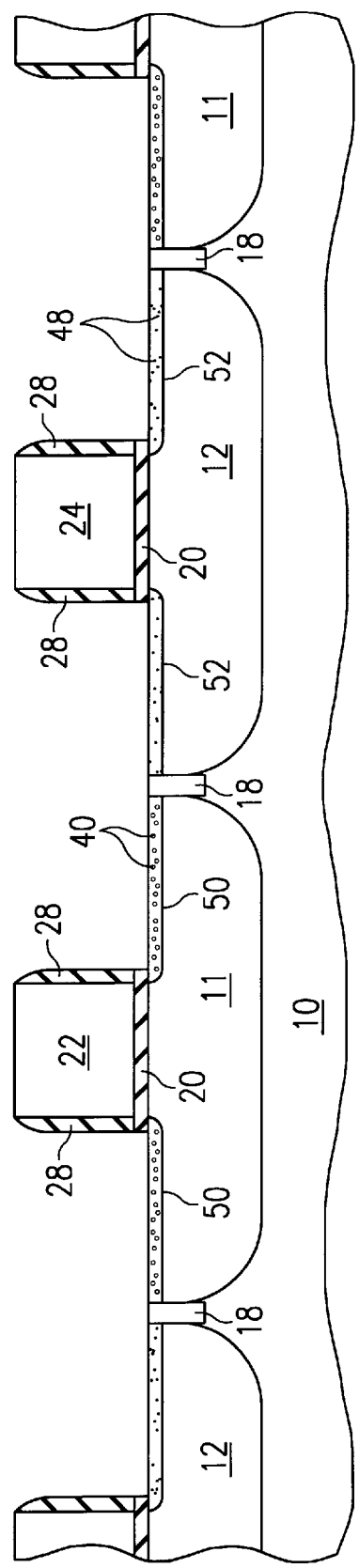

METHOD OF FABRICATING A SHALLOW DOPED REGION FOR A SHALLOW JUNCTION TRANSISTOR

This application claims priority under 35 USC §119 (e) (1) of provisional application No. 60/070,437, filed Jan. 5, 1998.

TECHNICAL FIELD OF THE INVENTION

This invention relates generally to the field of microelectronic devices, and more particularly to a method of fabricating a shallow doped region for a shallow junction transistor.

BACKGROUND OF THE INVENTION

Electronic equipment such as televisions, telephones, radios, and computers are often constructed using semiconductor components, such as integrated circuits, memory chips, and the like. The semiconductor components are typically constructed from various microelectronic devices fabricated on a semiconductor substrate, such as transistors, capacitors, diodes, resistors, and the like. Each microelectronic device is typically a pattern of conductor, semiconductor, and insulator regions formed on the semiconductor substrate.

The density of the microelectronic devices on the semiconductor substrate may be increased by decreasing the size, or linewidth, of the various semiconductor devices. The decrease in linewidth allows a larger number of such microelectronic devices to be formed on the semiconductor substrate. As a result, the computing power and speed of the semiconductor component may be greatly improved.

In order to decrease the linewidth of the microelectronic device, the size and thickness of the conductor, semiconductor, and insulator regions forming each microelectronic device must be reduced. As the size of the microelectronic device is scaled down to sub-micron sizes, there is a need to form shallow doped regions in the semiconductor substrate. For example, a shallow doped region may be used to construct a shallow junction transistor. Shallow junction transistors are less susceptible to current leakage and the formation of unwanted parasitic connections and devices.

Some techniques for fabricating a shallow doped region include the use of an ion beam to shallowly implant a dopant into the semiconductor substrate. As is well known to those in the art, the ion implantation process generally operates by ionizing and accelerating dopant atoms into the semiconductor substrate. The dopant atoms are thereby implanted into the semiconductor substrate. The doped region of the semiconductor substrate generally forms a conductive region, such as a source or drain component of a transistor.

The ion implantation process often damages the crystal lattice of the semiconductor substrate being implanted. In the case of shallow doped regions, ion implantation damage generally has a greater adverse affect because the size of the doped region is small. For example, damage to the source and drain regions of a shallow junction transistor may result in an increase in the leakage and in the threshold voltage of the transistor, thereby decreasing the performance of the transistor.

SUMMARY OF THE INVENTION

Accordingly, a need has arisen for an improved method of fabricating a shallow doped region for a shallow junction transistor. The present invention provides an improved method of fabricating a shallow doped region for a shallow junction transistor that substantially eliminates or reduces problems associated with the prior methods and systems.

In accordance with one embodiment of the present invention, a method of fabricating a shallow doped region in a substrate for a shallow junction transistor is provided. The method comprising the steps of providing a substrate having a first region and a second region. The first region and the second region include a first channel region and a second channel region, respectively. A first gate is formed proximate the first channel region and is separated from the substrate by a portion of a primary insulation layer. A second gate is formed proximate the second channel region and separated from the substrate by a portion of the primary insulation layer. A dopant layer is then formed outwardly of the substrate proximate the first and second regions. The dopant layer proximate the first region is implanted with a first dopant. The dopant layer proximate the second region is implanted with a second dopant. A portion of the first dopant in the dopant layer is diffused into the substrate proximate the first region to form a first shallow doped region, and a portion of the second dopant in the dopant layer is diffused into the substrate proximate the second region to form a second shallow doped region.

Important technical advantages of the present invention include providing a shallow doped region that is not damaged during an ion implantation process. In the case of a shallow junction transistor, the present invention allows the fabrication of a source and drain that are undamaged by ion implantation. Accordingly, the diode leakage and the threshold voltage of the shallow junction transistor may be reduced, thereby increasing the performance of the transistor.

Yet another technical advantage of the present invention includes providing a transistor having shallower drain and source regions. Accordingly, the linewidth of the microelectronic devices may be decreased. Thus, the present invention may allow the fabrication of transistors that are smaller than can be attained by some fabrication techniques.

Other technical advantages will be readily apparent to one skilled in the art from the following figures, description, and claims.

BRIEF DESCRIPTION OF THE DRAWINGS

For a more complete understanding of the present invention and its advantages thereof, reference is now made to the following description taken in conjunction with the accompanying drawings, wherein like reference numerals represent like parts, in which:

FIGS. 1A through 1I are a series of schematic cross-sectional diagrams illustrating the fabrication of a shallow doped region for a shallow junction transistor in accordance with the present invention.

DETAILED DESCRIPTION OF THE INVENTION

FIGS. 1A through 1I illustrate a method of fabricating a shallow doped region for a shallow junction transistor. As described in more detail below, the shallow doped region is fabricated by forming a dopant layer adjacent an outer surface of a semiconductor substrate and introducing a dopant into the dopant layer by means including implantation with the implantation being angled or non-angled. The dopant is then diffused from the dopant layer into the substrate to form the shallow doped region. Accordingly, the shallow doped region is formed without crystal lattice damage of the semiconductor substrate from ion implantation. In addition, the shallow doped region is formed without using extremely low energy implantation, which is difficult to control. In addition, multiple types of dopant may be used in the dopant layer to form different types of shallow junction transistors on the same semiconductor substrate.

Figure 1A:
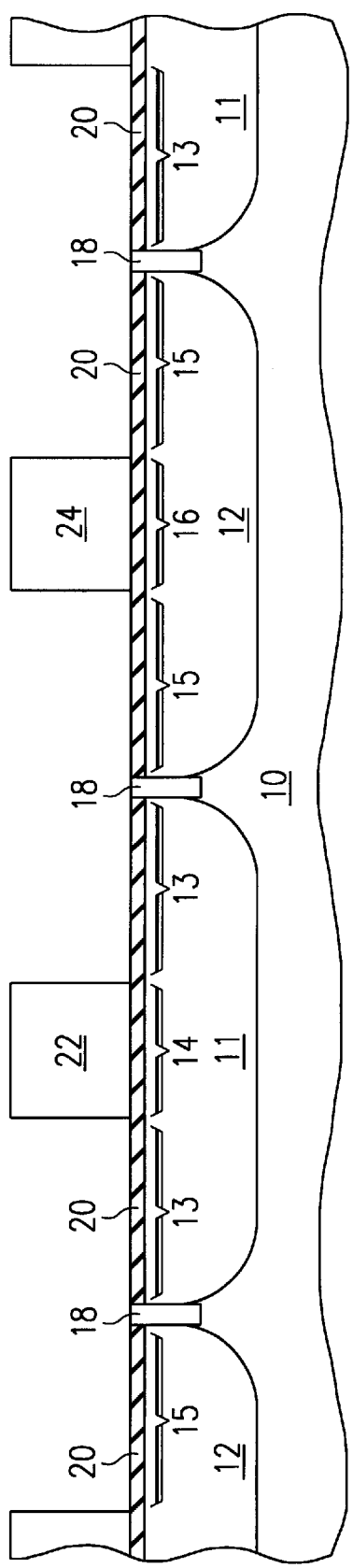

FIG. 1A illustrates an initial semiconductor structure having a substrate 10. In one embodiment, the substrate 10 is a wafer formed from a single-crystalline silicon material. It will be understood that the substrate 10 may comprise other suitable semiconductor materials and layers without departing from the scope of the present invention. For example, the substrate 10 may include an epitaxial semiconductor layer, a recrystallized semiconductor material, a polycrystalline semiconductor material, or any other suitable semiconductor material or layer.

The substrate 10 comprises a first well region 11 and a second well region 12.

The first and second well regions 11 and 12 are fabricated by conventional diffusion techniques. In one embodiment, the first and second well regions, 11 and 12, are doped with the same dopant to form the same type of well region, such as a p-type or an n-type region. In another embodiment, the first well region 11 is doped with a p-type dopant and the second well region 12 is doped with an n-type dopant. It will be understood that the first well region 11 and the second well region 12 may be otherwise doped without departing from the scope of the present invention.

The first well region 11 of the substrate 10 includes a first region 13 and a first channel region 14. The first channel region 14 separates the first region 13 into two portions. The second well region 12 of the substrate 10 includes a second region 15 and a second channel region 16. The second channel region 16 separates the second region 15 into two portions.

An isolation area 18 is formed in the substrate 10 between the first well region 11 and the second well region 12. The isolation area 18 electrically isolates each microelectronic device from an adjacent device. As illustrated, the isolation area 18 electrically insulates the first well region 11 from the second well region 12 as well as the first region 13 from the second region 15. The isolation area 18 is often formed using Shallow Trench Isolation (STI) structures or LOCal Oxidation of Silicon (LOCOS) structures. STI structures are generally formed by etching a trench on the order of 0.5 micron in depth into the substrate 10 and filling the trench with a suitable dielectric material, such as oxide. LOCOS structures are generally formed by thermally growing a localized oxidation layer to a thickness on the order of 400 to 600 nanometers. It will be understood that the isolation area 18 may be otherwise formed without departing from the scope of the present invention.

A primary insulation layer 20 is formed outwardly from the substrate 10. The primary insulation layer 20 operates to electrically insulate other elements of the transistor from the substrate 10. The primary insulation layer 20 is generally on the order of 20 to 60 Å in thickness. In one embodiment, the primary insulation layer 20 comprises silicon dioxide grown on the substrate 10. In another embodiment, the primary insulation layer 20 comprises nitrided oxide formed on the substrate 10. It will be understood that the primary insulation layer 20 may comprise other suitable materials for insulating semiconductor elements without departing from the scope of the present invention.

A first gate 22 and a second gate 24 are formed outwardly from the substrate 10 proximate the first channel region 14 and the second channel region 16, respectively. The gates 22 and 24 are separated from the substrate by the is primary insulation layer 20. The gates 22 and 24 are on the order of 1,000 Å in width and less than 2,500 Å in thickness. In one embodiment, the gates 22 and 24 are formed from a polycrystalline silicon (polysilicon) material. It will be understood that the gates 22 and 24 may comprise other suitable materials without departing from the present invention.

The gates 22 and 24 may be formed by depositing a gate layer (not shown) using conventional fabrication techniques, such as Chemical Vapor Deposition (CVD), Physical Vapor Deposition (PVD), or other such suitable fabrication technique. The gate layer is then patterned and etched using conventional photolithography techniques and such etching processes as Reactive Ion Etch (RIE) to form the gates 22 and 24. It will be understood that the gates 22 and 24 may be otherwise formed without departing from the scope of the present invention.

Figure 1B:
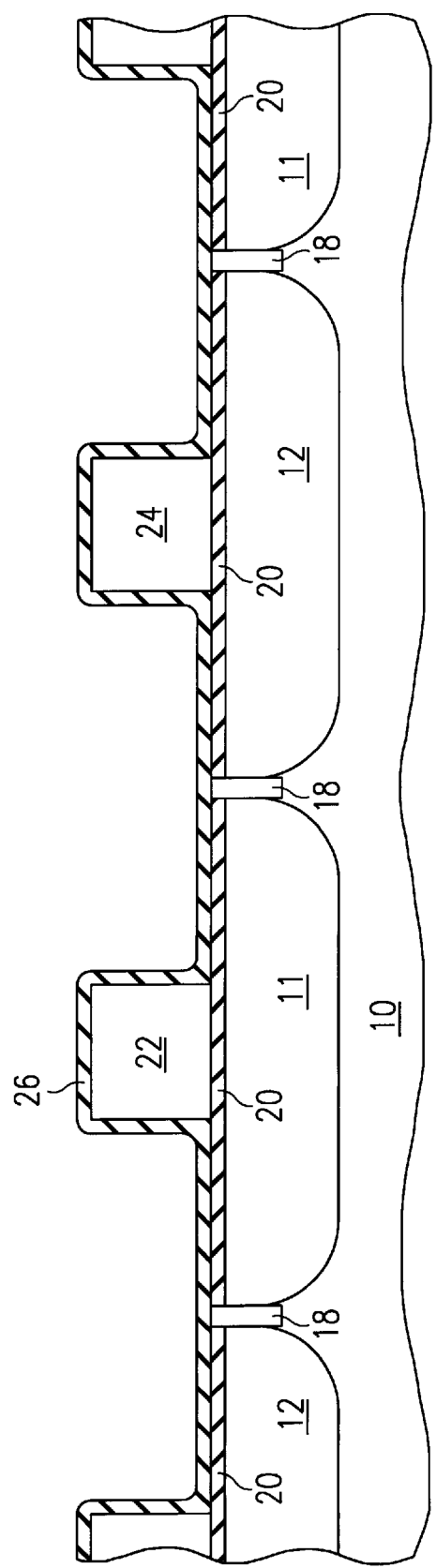

Referring to FIG. 1B, an optional sidewall layer 26 may be formed covering the insulation layer 20 and the gates 22 and 24. A thin oxide (not shown) on the order of approximately 20 to 80 Å may be grown prior to the formation of the sidewall layer 26. The sidewall layer 26 is deposited using conventional fabrication techniques, such as CVD. The sidewall layer 26 is generally on the order of 40 to 150 Å in thickness. In one embodiment, the sidewall layer 26 comprises silicon nitride. In another embodiment, the sidewall layer comprises silicon dioxide. It will be understood that the sidewall layer 26 may comprise other suitable insulating materials without departing from the scope of the present invention. For example, the sidewall layer 26 may comprise silicon oxynitride, or any other suitable insulating material.

Referring to FIG. 1C, a portion of the sidewall layer 26 is removed to form an optional sidewall insulation body 28 adjacent to each gate 22 and 24. The sidewall insulation body 28 electrically isolates the gate 22 and 24 from other elements of the transistor. The sidewall insulation body 28 is generally formed by anisotropically etching the sidewall layer 26. Anisotropic etching may utilize a reactive ion etch (RIE) using carbon fluorine-based gases such as $CF_4$ or $CHF_3$.

The portions of the insulation layer 20 proximate the first and second regions 13 and 15 is removed to expose the substrate 10. Thus, the insulation layer 20 is removed with the exception of that portion of the insulation layer 20 disposed between the substrate 10 and the gates 22 and 24. The process to remove the insulation layer 20 is selective to the insulation layer 20 and is non-selective to the substrate 10 and the gates 22 and 24. In other words, the removal process will readily remove the material comprising the insulation layer 20 without substantially removing the material comprising the substrate 10 and the gates 22 and 24. In addition, the removal process to remove a portion of the insulation layer 20 is non-selective to the material comprising the sidewall insulation bodies 28. The insulation layer 20 may be removed by plasma etching, wet etching, or other suitable processes. It will be understood that the etching process to remove the insulation layer 20 may include other processes without departing from the scope of the present invention.

Referring to FIGURE 1D, a dopant layer 34 is formed outwardly from the exposed portions of the substrate 10. The dopant layer 34 is generally on the order of 200 to 1,000 Å in thickness. The dopant layer 34 is deposited using such conventional fabrication technique as Low Pressure Chemical Vapor Deposition (LPCVD), Rapid Thermal Chemical Vapor Deposition (RTCVD) Physical Vapor Deposition (PVD), or other such suitable fabrication technique. In one embodiment, the dopant layer 34 may comprise a silicon germanium alloy. In this embodiment, the silicon germanium alloy is non-crystalline in form. In other words, the silicon germanium alloy may be amorphous or polycrystalline. The typical germanium concentration in the silicon germanium alloy is on the order of 30 to 75%. It will be understood that the dopant layer 34 may comprise other materials suitable for ion implantation without departing from the present invention.

Referring to FIG. 1E, a first mask 36 is formed covering the second gate 24 and the second region 15. The first mask 36 forms a barrier to ion implantation of the masked portions of the dopant layer 34. The first mask 36 is fabricated by conventional photolithography techniques. Photolithography fabrication of a mask generally includes applying a photoresist material to the surface of the semiconductor and focusing a pattern of light onto the photoresist material to cure the photoresist material in the same pattern as the light. The uncured photoresist material is removed to expose a portion of the underlying structure. It will be understood that the first mask 36 may comprise any material operable to form a suitable barrier to ion implantation without departing from the scope of the present invention. For example, the first mask 36 may comprise Deep UltraViolet (DUV) photoresist material, oxides, nitrides, or any other suitable material.

A first doped region 38 may be formed by ion implanting a first dopant 40 in the exposed portion of the dopant layer 34. Specifically, the dopant layer 34 proximate the first region 13 is implanted with ions to form the first doped region 38. As will be discussed in greater detail below, the implantation process generally operates by an ion beam 42 impinging dopant ions into a substance to change the material and electrical properties of the substance. The first dopant 40 implanted into the first doped region 38 is generally the opposite type of dopant from the dopant used to form the first well region 11. For example, in an embodiment in which the first well region 11 comprises a p-type dopant, the first dopant 40 is an n-type dopant, such as arsenic, phosphorous, strontium, or any other suitable n-type dopant material. Similarly, in an embodiment in which the first well region 11 comprises a n-type dopant, the first dopant 40 is a p-type dopant, such as boron, boron difluoride, indium, or any other suitable p-type dopant material. It will be understood that the first doped region 38 may be otherwise doped without departing from the scope of the present invention.

The ion beam 42 is generally characterized by the energy, dose, and species of material used in the ion beam 42. The energy, dose, and angle depend on the species of material and the depth that the material is to be implanted. In an embodiment in which the dopant layer 34 comprises a silicon germanium alloy and the first dopant 40 is arsenic, the ion beam 42 has an energy less than 10 KeV and a dose of 5E14–4E15 ions/cm$^2$. In an embodiment in which the dopant layer 34 is silicon germanium alloy and the first dopant is boron, the energy and dose of the dopant associated with the ion beam 42 is the same as described above for arsenic. It will be understood that the energy, dose, angle and material may be otherwise varied, including the use of phosphorus, antimony, rather than arsenic or boron di-fluorine rather than boron, provided that the dopant ions are not substantially implanted into the substrate 10.

Referring to FIG. 1F, the first mask 36 is removed and a second mask 44 is formed covering the first gate 22 and the first doped region 38. The second mask 44 forms a barrier to ion implantation of the first doped region 38. The second mask 44 may be fabricated in the same manner as described above for forming the first mask 36.

A second doped region 46 is formed by ion implanting a second dopant 48 in the exposed portion of the dopant layer 34. Specifically, the dopant layer 34 proximate the second region 15 is implanted with ions to form the second doped region 46. The ion implantation process is the same as the process described above for forming the first doped region 38. The second dopant 48 implanted into the second doped region 46 is generally the opposite type of dopant from the dopant used to form the second well region 12. For example, in an embodiment in which the second well region 12 comprises a p-type substrate, the second dopant 48 is typically an n-type dopant, such as arsenic, phosphorous, or any other suitable n-type dopant material. Similarly, in an embodiment in which the second well region 12 comprises an n-type substrate, the second dopant 48 is typically a p-type dopant, such as boron, boron difluoride, indium, or any other suitable p-type dopant material. The energy, dose, and materials are the same as previously described for forming the first doped region 38. It will be understood that the second doped region 46 may be otherwise doped without departing from the scope of the present invention.

Referring to FIG. 1G, the second mask 44 is then removed to expose both the first doped region 38 and the second doped region 46. The substrate 10 and the doped regions 38 and 46 are thermally treated to diffuse the respective dopants 40 and 48 into the substrate 10. The first doped region 38 diffuses the first dopant 40 into the substrate 10 proximate the first region 13 to form a first doped shallow region 50. Similarly, the second doped region 46 diffuses the second dopant 48 into the substrate 10 proximate the second region 15 to form a second doped shallow region 52. The first doped shallow region 50 is separated from the second doped shallow region 52 by the isolation area 18. The thermal treatment may include a Rapid Thermal Annealing (RTA) process, heating in a conventional furnace, or any combination thereof. In one embodiment, the thermal treatment includes heating the substrate 10 and the doped regions 38 and 46 to a temperature of approximately 800° C. for approximately 20 minutes followed by a rapid thermal anneal at 900–1,000° for 5–30 seconds. In another embodiment, a furnace anneal is not used prior to the rapid thermal treatment. In this embodiment, wherein boron and arsenic are the dopants, the thickness of the doped shallow regions 50 and 52 is on the order of 500 Å or less.

The thermal treatment process for diffusing the dopants 40 and 48 into the substrate 10 may be varied in both temperature and duration to provide varying depths of the doped shallow regions 50 and 52. In addition, the thermal treatment process for diffusing the respective dopants 40 and 48 may be independently performed to provide varying depths of the doped shallow regions 50 and 52. For example, the thermal treatment to form the first doped shallow region 50 may occur prior to the implantation process for forming the second doped region 46. Furthermore, the depths of the doped shallow regions 50 and 52 may be varied by varying the concentration of the dopant 40 and 48 within the respective doped regions 38 and 46. It will be understood that the temperature and duration of the thermal treatment may be varied without departing from the scope of the present invention.

Referring to FIG. 1H, the dopant layer 34, comprising the first doped region 38 and the second doped region 46, is removed to expose the gates 22 and 24 in addition to the doped shallow regions 50 and 52. The process to remove dopant layer 34 is selective to the material comprising the dopant layer 34. In other words, the dopant layer 34 removal process readily removes the material comprising the dopant layer 34 without substantially removing the material comprising the other components of the transistor, such as the gates 22 and 24, sidewall insulation body 28, and the substrate 10. In an embodiment in which silicon germanium is used as the dopant layer 34, the silicon germanium can be removed with high selectivity to silicon and other materials using a 1:1:5 $NH_4OH:H_2O_2:H_2O$ solution. Standard temperatures of 45 to 85° C. can be used. Lower temperatures have slightly better selectively but the etch rates are lower. Water dilution has little impact on selectivity; a 1:1:5 solution has the highest etch rate. Examples of selectivity of silicon germanium to silicon are 36:1 (with 40% germanium) and 177:1 (with 55% germanium). This etching process has been described in more detail in "Selective Chemical Etching of Polycrystalline SiGe alloys with respect to Si and $SiO_2$," by Johnson, et al., Journal of Electronic Materials, vol. 21, no. 8, pp. 805–810, 1992. It will be understood that the removal process to remove the dopant layer 34 may include other processes without departing from the scope of the present invention.

Figure 1I:
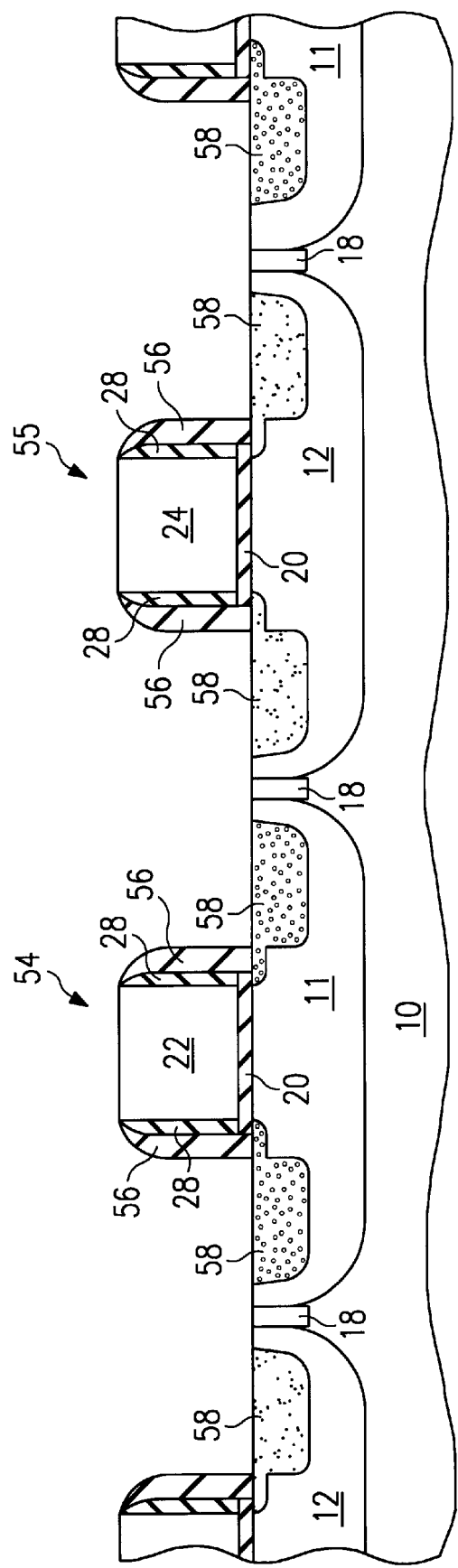

Referring to FIG. 1I, the semiconductor structure described above may be further processed to form a first shallow junction transistor 54. and a second shallow junction transistor 55. For example, a spacer 56 may be formed adjacent the sidewall insulation body 28 of each gate 22 and 24. The exposed portion of the substrate is then implanted with ions to form a first and a second deep junction 58 and 60 corresponding to the first and second shallow doped regions 50 and 52, respectively. It will be understood that the semiconductor structures may be otherwise processed to form the shallow junction transistors 54 and 55 without departing from the scope of the present invention.

Although the present invention has been described with several embodiments, various changes and modifications may be suggested to one skilled in the art. It is intended that the present invention encompass such changes and modifications that follow within the scope of the appended claims.

What is claimed is:

1. A method of forming a plurality of shallow junction transistors, the method comprising the steps of:
    providing a substrate having a first well region and a second well region separated by an isolation area, the first well region having a first region and a first channel region, the second well region having a second region and a second channel region;
    forming a primary insulation layer outward of the substrate;
    forming a first and second gate outward of the primary insulation layer proximate the first and second channel region, respectively;
    removing portions of the primary insulation layer to expose the substrate proximate the first and second region, the primary insulation layer disposed between the substrate and the first and second gates remaining intact;
    forming a contiguous dopant layer covering the exposed portion of the substrate;
    introducing a first dopant into the dopant layer proximate the first region;
    introducing a second dopant into the dopant layer proximate the second region; and
    simultaneously diffusing a portion of the first dopant in the dopant layer into the substrate proximate the first region to form a first shallow doped region and
    a portion of the second dopant in the dopant layer into the substrate proximate the second region of the substrate to form a second shallow doped region wherein the first shallow doped region forms, at least in part, a source and a drain for a first shallow junction transistor and the second shallow doped region forms, at least in part, a source and a drain for a second shallow junction transistor.

2. The method of claim 1, wherein the first well region is doped with a p-type dopant and the first dopant is an n-type dopant.

3. The method of claim 2, wherein the second well region is doped with an n-type dopant and the second dopant is a p-type dopant.

4. The method of claim 1, further comprising the step of removing the dopant layer.

5. The method of claim 4, wherein the first and second well region are doped with the same type of dopant, and the first and second dopant are the same type of dopant.

6. The method of claim 1, wherein the step of forming a dopant layer comprises the step of forming a dopant layer comprising a silicon germanium alloy covering the exposed portion of the substrate.

7. The method of claim 1, wherein the second dopant is a p-type dopant selected from the group consisting of boron, boron difluoride, and indium.

8. The method of claim 1, further comprising the step of forming a sidewall insulation body adjacent the gate prior to the step of forming a dopant layer.

9. The method of claim 1, further comprising the step of forming a first deep doped region and a second deep doped region partially overlapping the first and second shallow doped regions, respectively.

10. A method of forming a plurality of doped regions in a substrate, the method comprising the steps of:
    providing the substrate, the substrate comprising a first region and a second region, the substrate also comprising a first channel region within the first region and a second channel region within the second region;
    forming a first gate proximate the first channel region and separated from the substrate by a portion of a primary insulation layer;
    forming a second gate proximate the second channel region and separated from the substrate by a portion of the primary insulation layer;
    forming a contiguous dopant layer outward of the substrate proximate the first and second regions;
    introducing a first dopant into the dopant layer proximate the first region;
    introducing a second dopant into the dopant layer proximate the second region;
    simultaneously diffusing a portion of the first dopant in the dopant layer into the substrate proximate the first region to form a first doped region and diffusing a portion of the second dopant in the dopant layer into the substrate proximate the second region to form a second doped region.

11. The method of claim 10, further comprising the step of removing the dopant layer after the steps of diffusing a portion of the first and second dopant into the substrate.

12. The method of claim 11, wherein the first and second dopant are the same dopant.

13. The method of claim 10, further comprising the step of forming a sidewall insulation body adjacent the first and second gate.

14. The method of claim 10, further comprising the step of forming an isolation area between the first region and the second region of the substrate.

15. The method of claim 10, wherein the step of forming a dopant layer comprises the step of forming a dopant layer comprising a silicon germanium alloy outward of the substrate proximate the first and second regions.

16. A method of forming a doped region, comprising the steps of:

providing a substrate with a first well region having a first region and a first channel region;

forming a primary insulation layer outwardly from the substrate;

forming a first gate outwardly from the primary insulation layer proximate the first channel region;

removing the primary insulation layer to expose the substrate proximate the first region, the primary insulation layer disposed between the substrate and the first gate is not removed;

forming a contiguous dopant layer covering the exposed portion of the substrate;

introducing a first dopant into the dopant layer proximate the first region;

diffusing a portion of the first dopant in the dopant layer into the substrate proximate the first region to form a doped region; and removing the contiguous dopant layer.

17. The method of claim 16, further comprising the step of removing the dopant layer.

18. The method of claim 17, wherein the first and second well regions are doped with the same type of dopant, and the first and second dopants are the same type of dopant.

19. The method of claim 16, wherein the step of step of diffusing a portion of the first dopant is prior to the step of forming a second mask.

20. The method of claim 16, wherein the step of forming a dopant layer comprises the step of forming a dopant layer comprising a silicon germanium alloy covering the exposed portion of the substrate.

* * * * *